United States Patent
Choi et al.

(10) Patent No.: US 8,213,254 B2
(45) Date of Patent: Jul. 3, 2012

(54) NONVOLATILE MEMORY DEVICE WITH TEMPERATURE CONTROLLED COLUMN SELECTION SIGNAL LEVELS

(75) Inventors: Byung-Gil Choi, Gyeonggi-do (KR); Du-Eung Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 410 days.

(21) Appl. No.: 12/504,949

(22) Filed: Jul. 17, 2009

(65) Prior Publication Data
US 2010/0014345 A1    Jan. 21, 2010

(30) Foreign Application Priority Data
Jul. 21, 2008    (KR) .................. 10-2008-0070655

(51) Int. Cl.
*G11C 7/04*    (2006.01)

(52) U.S. Cl. .................. 365/211; 365/163; 365/212

(58) Field of Classification Search .............. 365/163 X, 365/175, 189.011, 189.09, 211 O, 212 X, 365/163, 211, 212
See application file for complete search history.

(56) References Cited

U.S. PATENT DOCUMENTS

| | | | |
|---|---|---|---|
| 5,488,585 A * | 1/1996 | Kim | 365/190 |
| 6,885,602 B2 * | 4/2005 | Cho et al. | 365/211 |
| 7,020,014 B2 | 3/2006 | Khouri et al. | |
| 7,113,424 B2 | 9/2006 | Happ et al. | |
| 7,166,900 B1 * | 1/2007 | Mun et al. | 257/467 |
| 7,315,469 B2 * | 1/2008 | Choi et al. | 365/163 |
| 7,548,451 B2 * | 6/2009 | Oh et al. | 365/163 |
| 7,907,435 B2 * | 3/2011 | Osada et al. | 365/148 |

FOREIGN PATENT DOCUMENTS
KR    10-2005-0020356 A    3/2005
* cited by examiner

*Primary Examiner* — VanThu Nguyen
(74) *Attorney, Agent, or Firm* — Myers Bigel Sibley & Sajovec, P.A.

(57) ABSTRACT

A nonvolatile memory device includes a memory cell array with a matrix of nonvolatile memory cells. The nonvolatile memory cells may store data using variable resistive elements. A plurality of bitlines are coupled to a plurality of nonvolatile memory cell arrays in the memory cell array. A column selection circuit selects among the bitlines in response to a column selection signal. A controller regulates a level of the column selection signal in response to a temperature signal from a temperature sensor. The temperature sensor may be configured to measure temperature outside the nonvolatile memory device to generate the temperature signal.

20 Claims, 8 Drawing Sheets

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |

| 300_1 | 300_2 | 300_3 | 300_4 |
|---|---|---|---|

| PERIPHERY(3) |
|---|

| 300_8 | 300_7 | 300_6 | 300_5 |
|---|---|---|---|

| | BLK7 | BLK7 | BLK7 | BLK7 | BLK7 | BLK7 | BLK7 | BLK7 |
|---|---|---|---|---|---|---|---|---|
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

NONVOLATILE MEMORY DEVICE WITH TEMPERATURE CONTROLLED COLUMN SELECTION SIGNAL LEVELS

CROSS-REFERENCE TO RELATED APPLICATION

This application claims priority from Korean Patent Application No. 10-2008-0070655 filed on Jul. 21, 2008 in the Korean Intellectual Property Office, the disclosure of which is incorporated herein by reference in its entirety.

BACKGROUND OF THE INVENTION

1. Field of the Invention

The present invention relates to nonvolatile memory devices and, more particularly, to controlling access to memory cells within nonvolatile memory devices.

2. Description of the Related Art

Some types of nonvolatile memory devices use resistance materials, such as resistive random access memory (RRAM) devices, magnetic random access memory (MRAM) devices, and phase-change random access memory (PRAM) devices. These nonvolatile memory devices can store data using changes in the state of a phase-change material such as a chalcogenide alloy (in the case of PRAM devices), changes in the resistance of a variable-resistance material (in the case of RRAM devices), or changes in the resistance of a magnetic tunnel junction (MTJ) film in accordance with the magnetization state of a ferromagnetic material (in the case of MRAM devices). In contrast, dynamic random access memory (DRAM) devices or flash memory devices store data using electric charges.

In the case of PRAM devices, in particular, a phase-change material is controllably changed between crystalline or amorphous states through controlled heating and cooling cycles. The resistance of a phase-change material in a crystalline state is high, whereas the resistance of a phase-change material in an amorphous state is low. Thus, a phase-change material in a crystalline state may be defined as set data or a binary value of 0 and a phase-change material in an amorphous phase may be defined as reset data or a binary value of 1.

SUMMARY OF THE INVENTION

In some embodiments, a nonvolatile memory device includes a memory cell array that includes a matrix of nonvolatile memory cells. A plurality of bitlines are coupled to a plurality of nonvolatile memory cell columns in the memory cell array. A column selection circuit selects among the bitlines in response to a column selection signal. A controller regulates a level of the column selection signal in response to a temperature signal from a temperature sensor.

In some further embodiments, the controller includes the temperature sensor, and the temperature sensor is configured to measure temperature outside the nonvolatile memory device to generate the temperature signal.

In some further embodiments, the controller causes the column selection signal to have a first level in response to the temperature signal indicating a first temperature and causes the column selection signal to have a second level, which is higher than the first level, in response to the temperature signal indicating a second temperature that is higher than the first temperature.

In some further embodiments, the controller is configured to operate during a write operation for writing data to the memory cell array so as to regulate the level of the column selection signal in response to the temperature signal during the write operation.

In some further embodiments, the controller includes a column bias controller that is configured to output a column bias having a level that is regulated in response to the temperature signal, and includes a column decoder that is configured to provide the column selection signal in response to the column bias and a column address. The column bias controller may include the temperature sensor that generates the temperature signal and include a column bias generator that is configured to provide a column bias whose voltage is regulated in response to the temperature signal.

In some further embodiments, the nonvolatile memory device further includes a plurality of wordlines coupled to a plurality of nonvolatile memory cell rows in the cell array, and includes a row selection circuit that is configured to select among the wordlines in response to a row selection signal. The controller can be configured to regulate a level of the row selection signal in response to the temperature signal.

In some other embodiments, a nonvolatile memory device includes a memory cell array having a matrix of nonvolatile memory cells. A plurality of wordlines are coupled to a plurality of nonvolatile memory cell rows in the cell array. A plurality of bitlines are coupled to a plurality of nonvolatile memory cell columns in the memory cell array. A column selection circuit selects among the bitlines in response to a column selection signal. A column decoder provides the column selection signal to the column selection circuit. The controller regulates a level of the column selection signal in response to a temperature signal from a temperature sensor.

In some further embodiments, the bitlines include a plurality of local bitlines and a plurality of global bitlines. The local bitlines are directly coupled to the nonvolatile memory cell columns. The global bitlines are selectively coupled to the local bitlines. The column selection circuit is a local column selection circuit that selects among the local bitlines in response to a local column selection signal. The column decoder is a local column decoder that is configured to provide the local column selection signal to the local column selection circuit. The controller is configured to regulate the level of the local column selection signal in response to the temperature signal.

BRIEF DESCRIPTION OF THE DRAWINGS

The above and other aspects and features of the present invention will become more apparent by describing in detail exemplary embodiments thereof with reference to the attached drawings, in which:

FIG. 1 illustrates a functional diagram of a nonvolatile memory device according to some exemplary embodiments of the present invention;

DETAILED DESCRIPTION OF THE EXEMPLARY EMBODIMENTS

Figure 2:
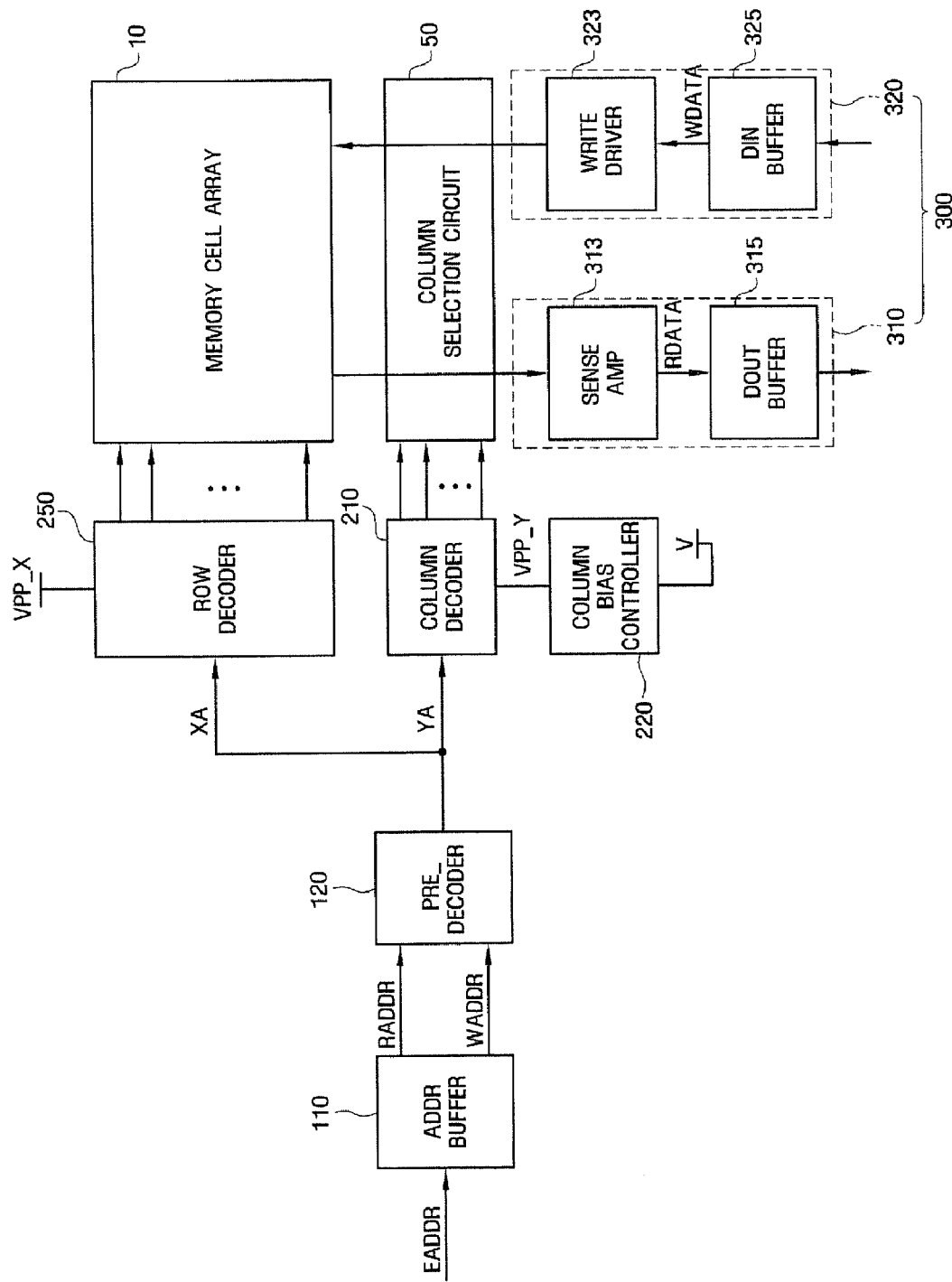
FIG. 2 illustrates a schematic block diagram of a nonvolatile memory device according to some exemplary embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention will hereinafter be described in detail in the context of a phase-change random access memory (PRAM) device. However, the present invention is not restricted to PRAM type devices. That is, the present invention can also be applied to other nonvolatile memory devices, such as those using a resistive element, including, but not limited to, resistive random access memory (RRAM) devices and ferroelectric random access memory (FRAM) devices.

FIG. 1 illustrates a functional diagram of a nonvolatile memory device according to some exemplary embodiments of the present invention. Various exemplary embodiments are described below in the context of a nonvolatile memory device having 16 memory banks. However, it is to be understood that the present invention is not restricted to the particular nonvolatile memory device configuration shown in FIG. 1.

Referring to FIG. 1, the nonvolatile memory device may include a memory cell array, a plurality of input/output (I/O) circuits 300_1 through 300_8, and a peripheral circuit region 3.

The memory cell array may include a plurality of memory banks 1_1 through 1_16. Each of the memory banks 1_1 through 1_16 may include a plurality of memory blocks BLK0 through BLK7. Each of the memory blocks BLK0 through BLK7 may include a plurality of nonvolatile memory cells arranged in a matrix. Each of the memory banks 1_1 through 1_16 is illustrated in FIG. 1 as including eight memory blocks, but the present invention is not restricted to this particular configuration. The memory cell array is also described in further detail below with reference to FIG. 3.

The nonvolatile memory device may further include a row selection circuit (not shown) that selects among the memory cell array a row of nonvolatile memory cells to/from which data is to be written/read, and may further include a column selection circuit (not shown) that selects among the memory cell array a column of nonvolatile memory cells to/from which data is to be written/read.

Each of the I/O circuits 300_1 through 300_8 may correspond to two memory banks and may perform a read operation or a write operation on the two memory banks. However, the present invention is not restricted to this. That is, each of the I/O circuits 300_1 through 300_8 may correspond to one or four memory banks.

The column selection circuit, the row selection circuit, and a plurality of logic circuit blocks for driving the I/O circuits 300_1 through 300_8, and a voltage generator may be disposed in the peripheral circuit region 3 (FIG. 1).

Figure 3:
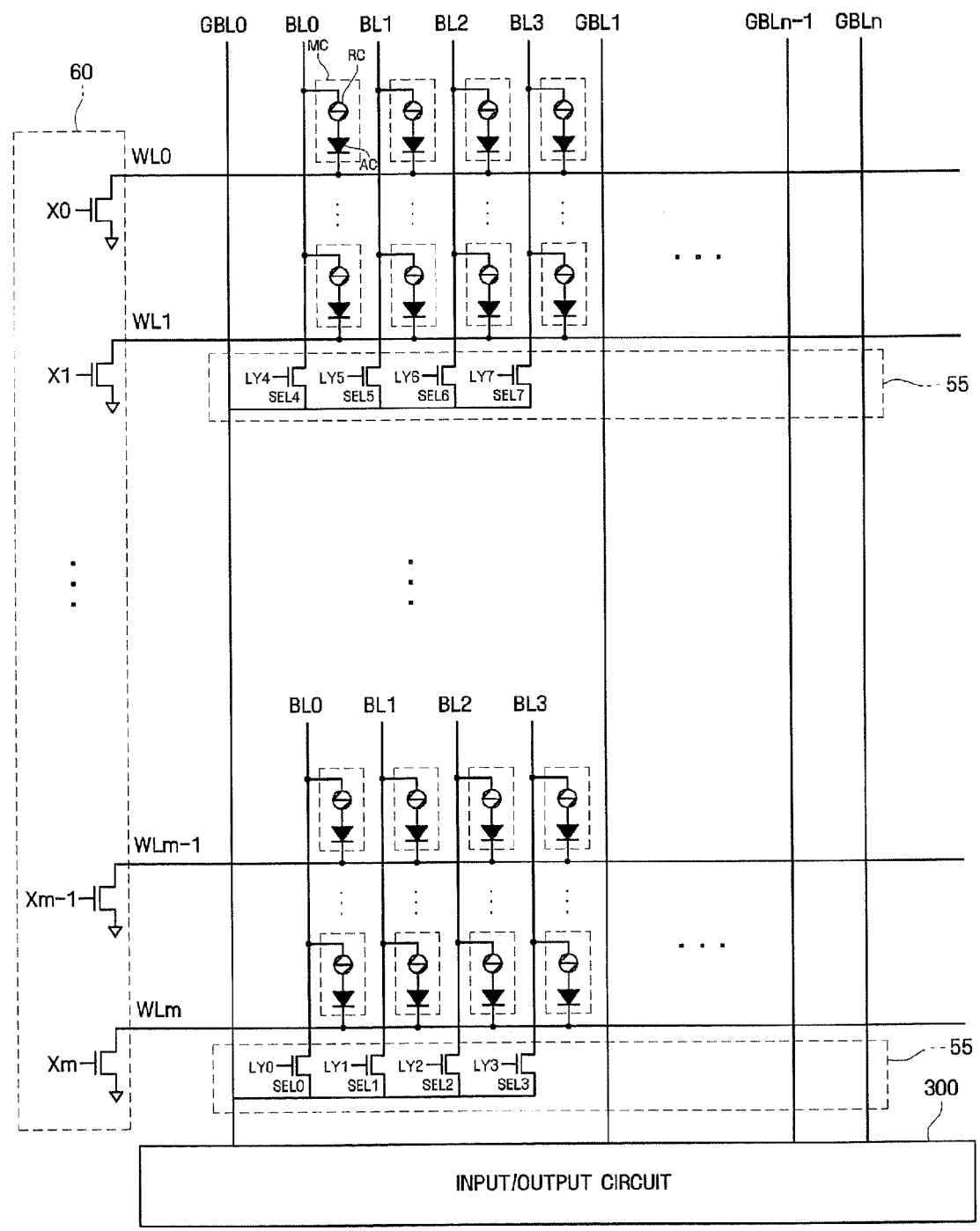
FIG. 3 illustrates a circuit diagram of the nonvolatile memory device shown in FIG. 2 according to some exemplary embodiments of the present invention.

FIG. 2 illustrates a schematic block diagram of a nonvolatile memory device according to some exemplary embodiments of the present invention, and FIG. 3 illustrates a circuit diagram of the nonvolatile memory device shown in FIG. 2 according to some exemplary embodiments of the present invention. For convenience of illustration, a global bitline selection circuit is not illustrated in FIG. 3. Instead, a plurality of local bitlines and a local bitline selection circuit are illustrated in detail in FIG. 3.

Referring to FIGS. 2 and 3, the nonvolatile memory device may include a memory cell array 10, a column selection circuit 50, a column decoder 210, a column bias controller 220, a row decoder 250, a predecoder 120, an address buffer 110 and an I/O circuit 300.

The memory cell array 10 may include a matrix of a plurality of nonvolatile memory cells MC. The nonvolatile memory cell matrix may include a plurality of nonvolatile memory cell rows respectively coupled to a plurality of wordlines WL0 through WLm and a plurality of nonvolatile memory cell columns respectively coupled to a plurality of bitlines.

Each of the nonvolatile memory cells MC may include a variable resistive element RC having a phase-change material whose resistance varies according to whether the state of the phase-change material is a crystalline state or an amorphous state, and an access element AC controlling a current that flows in the variable resistive element RC. The access element AC may be a diode or a transistor connected in series to the variable resistive element RC. The access element AC is illustrated in FIG. 3 as being a diode, but the present invention is not restricted to this. A phase-change random access memory (PRAM) cell having a diode as an access element is referred to as a diode-controlled PRAM cell. The phase-change material of the variable resistive element RC may be a binary compound such as GaSb, InSb, InSe, Sb2Te3 and/or GeTe; a ternary compound such as GeSbTe, GaSeTe, InSbTe, SnSb2Te4, and/or InSbGe; or a quaternary compound such as AgInSbTe, (GeSn)SbTe, GeSb(SeTe), and/or Te81Ge15Sb2S2. More specifically, the phase change material of the variable resistive element RC may be GeSbTe.

As the storage capacity and the integration density of non-volatile memory devices increase, an increasing number of nonvolatile memory devices have been designed to have a hierarchical bitline structure including a plurality of global bitlines and a plurality of local bitlines. The exemplary embodiments of the present invention will hereinafter be described in detail, taking a nonvolatile memory device having a hierarchical bitline structure as an example. However, the present invention can also be applied to a nonvolatile memory device not having a hierarchical bitline structure.

Referring to FIGS. 2 and 3, the nonvolatile memory device may have a hierarchical bitline structure including a plurality of global bitlines GBL0 through GBLn and a plurality of local bitlines BL0 through BL3. The global bitlines GBL0 through GBLn may be selectively coupled to the local bitlines BL0 through BL3 through the local column selection circuit 55, and each of the local bitlines BL0 through BL3 may be coupled to the nonvolatile memory cells MC. For convenience, each of the global bitlines GBL0 through GBLn is illustrated in FIG. 3 as being coupled to four local bitlines, but the present invention is not restricted to this configuration. That is, the number of local bitlines coupled to each of the global bitlines GBL0 through GBLn may be any defined number.

The wordlines WL0 through WLm may form a hierarchical wordline structure and may thus include a plurality of main wordlines (not shown) and a plurality of sub-wordlines (not shown).

The column selection circuit 50 may couple some of the bitlines to the I/O circuit 300 in response to a column selection signal. The level of the column selection signal (e.g., current level and/or voltage level) may be regulated in response to a temperature signal that is indicative of the temperature sensed outside the nonvolatile memory device (hereinafter referred to as the outside temperature), such as the air temperature adjacent to the nonvolatile memory device. That is, the level of the column selection signal can be regulated so as to increase and decrease to track changes in the outside temperature. In some other embodiments, the level of a column selection signal (e.g., current level and/or voltage level) may be regulated in response to a temperature signal that is indicative of the temperature sensed inside the nonvolatile memory device. Accordingly, in some embodiments a temperature sensor that generates the temperature signal is configured to measure temperature outside the nonvolatile memory device, while in some other embodiments the temperature sensor is configured to measure temperature inside the nonvolatile memory device.

Since the nonvolatile memory device has a hierarchical bitline structure including the local bitlines BL0 through B13 and the global bitlines GBL0 through GBLn, the column selection circuit 50, the column selection circuit 50 may be designed to have a hierarchical structure including a local column selection circuit 55 and a global bitline selection circuit (not shown) and may choose a nonvolatile memory cell column using the local column selection circuit 55 and the global bitline selection circuit. More specifically, the local column selection circuit 55 may choose some of the local bitlines BL0 through BL3 in response to a plurality of local column selection signals LY0 through LY7 and may couple the chosen local bitline(s) to the global bitlines GBL0 through GBLn. The global column selection circuit may choose some of the global bitlines GBL0 through GBLn in response to a global column selection signal and may couple the chosen global bitline(s) to the I/O circuit 300. In this manner, a nonvolatile memory cell column may be chosen.

The local column selection circuit 55 may include a plurality of local column selection switches SEL0 through SEL7. Each of the local column selection switches SEL0 through SEL7 may be coupled to the local bitlines BL0 through B13 and may select at least one of the local bitlines BL0 through BL3 in response to the local column selection signals LY0 through LY7. The levels of the local column selection signals LY0 through LY7 may be regulated in response to a temperature signal that is indicative of the outside temperature. That is, the levels of each of the local column selection signals LY0 through LY7 can be regulated to increase and decrease in a defined manner so as to track changes in the outside temperature.

In this manner, it may be possible to provide a desirable penetration current level (such as a write current or a read current) that flows through each of the nonvolatile memory cells MC to ground by regulating the penetration current level using the I/O circuit 300 to track variations in the outside temperature, so that the penetration current level is adjusted to compensate for temperature induced variation in the electric resistance along the path of the penetration current. Such operation may improve the write/read performance of a nonvolatile memory device over a wide range of operating temperatures. These and other potential features will be described in further detail below with reference to FIGS. 4 and 5.

The column decoder 210 receives a column bias VPP_Y from the column bias controller 220 and receives a column address YA from the predecoder 120. Thereafter, the column decoder 210 provides a column selection signal to the column selection circuit 50. More specifically, the column decoder 210 may provide a column selection signal whose level is determined based on the outside temperature, to the column selection circuit 50.

Since the nonvolatile memory device has a hierarchical bitline structure including the local bitlines BL0 through B13 and the global bitlines GBL0 through GBLn, the column decoder 210 may be designed as a hierarchical column decoder including a local column decoder and a global column decoder. In this case, the local column decoder may provide the local column selection signals LY0 through LY7, whose levels are regulated in response to the outside temperature, to the local column selection circuit 55.

The column bias controller 220 may be provided with a predetermined voltage V (e.g., a boosted voltage VPP or a power supply voltage VCC), and may thus provide the column bias VPP_Y, whose level is regulated in response to the outside temperature to, the column decoder 210. That is, the column bias controller 220 may provide the column bias VPP_Y to the column decoder 210 to cause the column decoder 210 to provide a column selection signal whose level is regulated in response to the outside temperature. When the column decoder 210 includes a local column decoder and a global column decoder, the column bias controller 220 may provide the column bias VPP_Y to the local column decoder and/or the global column decoder. The structure and the operation of the column bias controller 220 will be described in further detail below with reference to FIG. 8.

The row decoder 250 may receive a row address XA from the pre-decoder 120 and respond thereto to select a nonvolatile memory cell column MC to/from which data is to be written/read. For example, the row decoder 250 may provide a plurality of row selection signals X0 through Xm to the row selection circuit 60 to enable a row selection switch in the row selection circuit 60. The level of a row bias VPP_X, which is applied to the row decoder 250 during a write or read operation, may be higher than the level of the power supply voltage VCC.

The address buffer 110 may receive an external address EADDR, may buffer the external address EADDR, and may provide a read address RADDR for performing a read operation or a write address WADDR for performing a write operation to the predecoder 120.

The I/O circuit 300 may be coupled to the bitlines and may thus input data or output data from the memory cell array 10. The I/O circuit 300 may include a write circuit 320 and a read circuit 330.

The write circuit 320 may be coupled to the bitlines, and may write data in the memory cell array 10. The write circuit 320 may include a data input buffer 325 and a write driver 323. The data input buffer 325 may receive external data, may buffer the external data, and may provide write data WDATA to the write driver 323. The write driver 323 may receive the write data WDATA and may write data to a number of non-volatile memory cells MC chosen from the memory cell array 10.

The read circuit 310 may be coupled to the bitlines, and may read data from the memory cell array 10. The read circuit 310 may include a sense amplifier 313 and a data output buffer 315. The sense amplifier 313 may read read data RDATA from a number of nonvolatile memory cells MC selected among the memory cell array 10. The data output buffer 315 may output the read data RDATA.

The operation of the nonvolatile memory device shown in FIG. 2, and particularly, a write operation, will hereinafter be described in detail with reference to FIGS. 4 through 6B. However, embodiments of the present invention can also be applied to a read operation.

Figure 4:
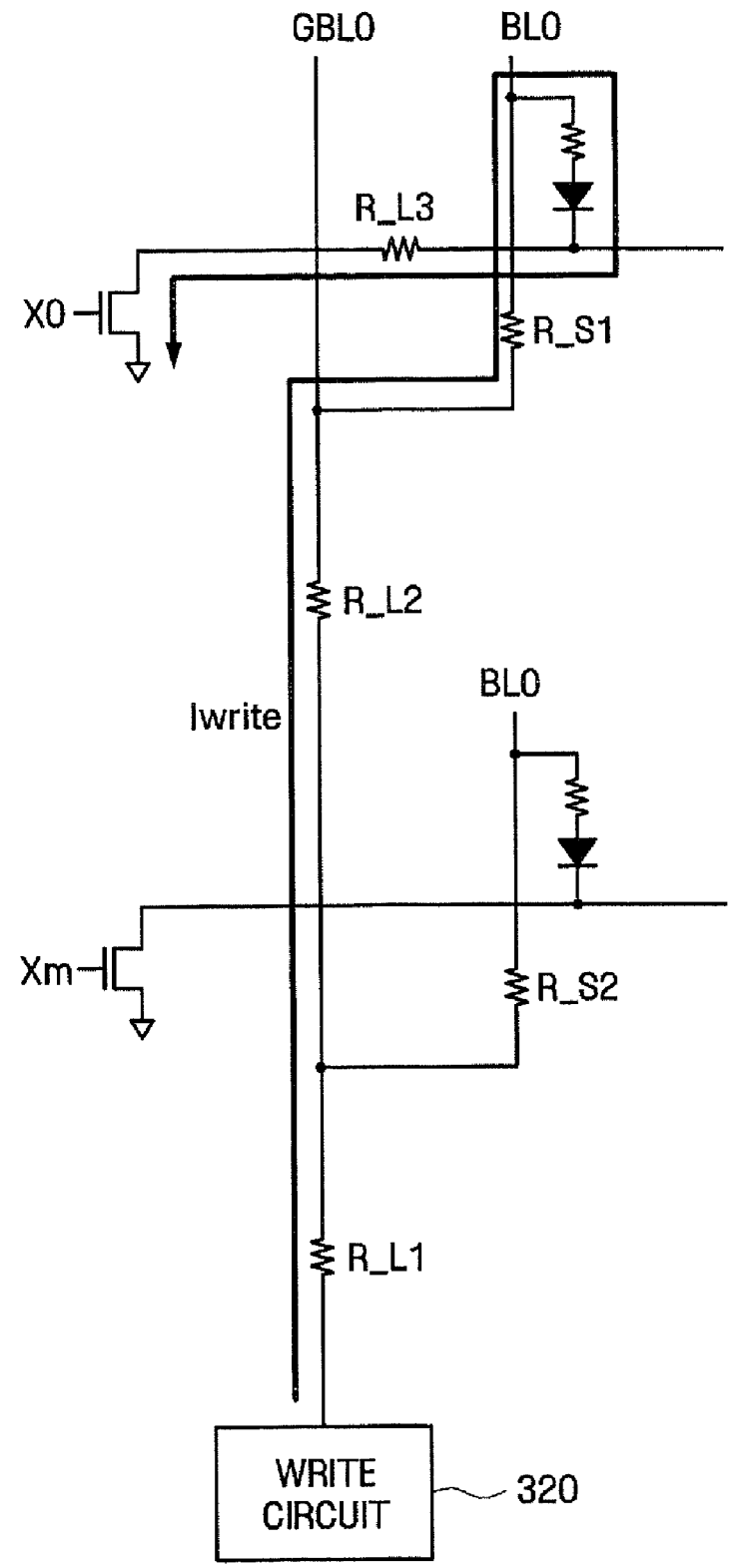
FIG. 4 illustrates a circuit diagram that performs a write operation for the nonvolatile memory device shown in FIG. 2 according to some exemplary embodiments of the present invention.
Figure 5:
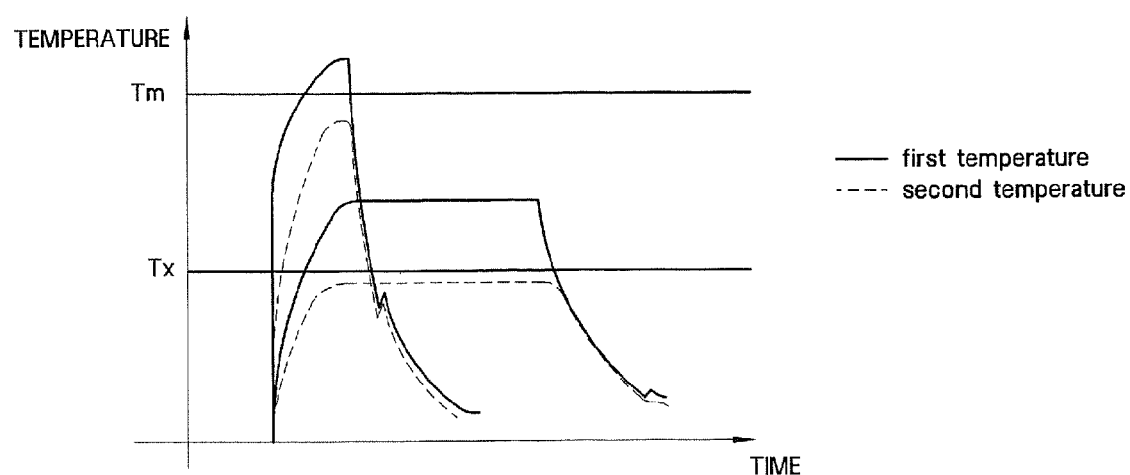
FIG. 5 illustrates a graph showing a set of conditions for changing the phase of the phase-change material of a nonvolatile memory cell according to some exemplary embodiments of the present invention.
Figure 6A:
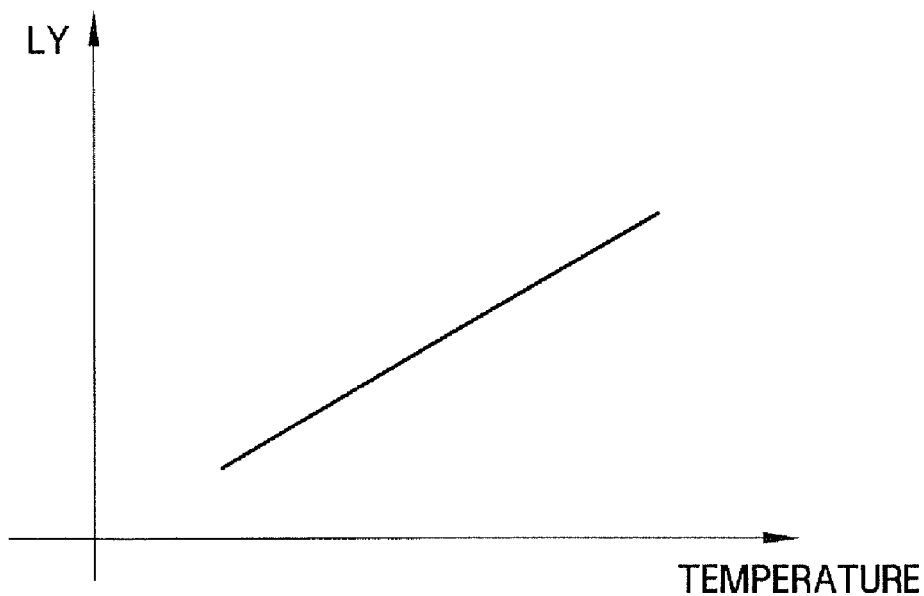
FIGS. 6A and 6B illustrate graphs showing various operations of a column bias controller shown in FIG. 2 according to some exemplary embodiments of the present invention.
Figure 6B:
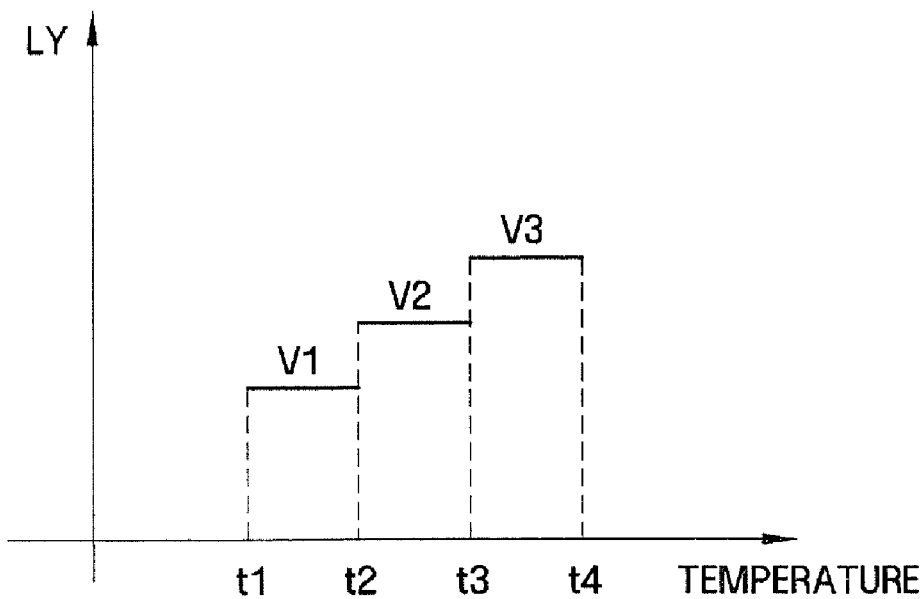

FIG. 4 illustrates a circuit diagram that performs a write operation for the nonvolatile memory device shown in FIG. 2. FIG. 5 illustrates a graph showing a set of conditions for changing the phase of the phase-change material of a non-volatile memory cell. FIGS. 6A and 6B illustrate graphs showing various operations of the column bias controller 220 shown in FIG. 2.

Referring to FIGS. 4 and 5, one of the wordlines WL0 through WLn, for example, the wordline WL0, may be selected by the row decoder 60, and one of the local bitlines BL0 through BL3, e.g., the local bitline BL0, may be selected by the column decoder 210, thereby selecting a nonvolatile memory cell MC to which data is to be written. If the access elements AC of the nonvolatile memory cells MC are diodes, the chosen wordline, i.e., the wordline WL0, may be set to a low level so that the diode of the chosen nonvolatile memory cell MC can be turned on.

Data may be written to the chosen nonvolatile memory cell MC by using joule heat generated by applying a write current Iwrite to the variable resistive element RC of the chosen nonvolatile memory cell MC. More specifically, the phase-change material of the variable resistive element RC of the chosen nonvolatile memory cell MC may be heated to a temperature higher than its melting point Tm and may then be quickly cooled, thereby realizing an amorphous state corresponding to a first logic level. Alternatively, the phase-change material of the variable resistive element RC of the chosen nonvolatile memory cell MC may be heated to and maintained at a temperature lower than its melting point Tm, and may then be cooled, thereby realizing a crystalline state corresponding to a second logic level. In order to change the phase of the phase-change material of the variable resistive element RC of the chosen nonvolatile memory cell MC, it is important to keep applying the write current Iwrite to the chosen nonvolatile memory cell MC for a predefined amount of time. Even if the write current Iwrite is properly applied to the chosen nonvolatile memory cell MC for the predefined amount of time, wrong data may be written to the chosen nonvolatile memory cell MC due to undesirable effects of the outside temperature.

More specifically, electric resistance along the path of the write current Iwrite, which is provided by the write circuit 320 and flows to a ground through the chosen nonvolatile memory cell MC, can vary as function of the outside temperature. For example, various resistors such as a plurality of parasitic resistors R_L1 through R_L3 on a bitline (e.g., the global bitline GBL0 or the local bitline BL0), a plurality of internal resistors R_S1 and R_S2 in the transistors of the column selection circuit 50 and the row selection circuit 60 can be electrically connected along the path of the write current Iwrite. The resistances of the various resistors R_L1 through R_L3, R_S1, and R_S2 can increase and decrease as a function of the changes in the outside temperature.

Consequently, the write current Iwrite can vary in response to changes in the outside temperature. Thus, the level of the write current Iwrite that occurs at a first outside temperature may be different from the level of the write current Iwrite the occurs at a higher second outside temperature. For example, the level of the write current Iwrite at the higher second outside temperature may be lower than the level of the write current Iwrite at the first outside temperature. However, in accordance with some embodiments, the write current Iwrite is regulated in response to the outside temperature so as to compensate for temperature induced effects thereon so that data can be properly written to a selected nonvolatile memory cell MC using joule heat from the write current Iwrite supplied to the variable resistive element RC of the selected nonvolatile memory cell RC.

In the exemplary embodiment of FIG. 2, a column selection signal, having a level that is regulated in response to the outside temperature, is provided to the column selection circuit 50. Therefore, the write current Iwrite may be regulated to be within a desired range substantially independent of variation in the outside temperature.

More specifically, a plurality of local column selection signals LY0 through LY7 having a first level may be provided to the column selection circuit 50 in response to a temperature signal indicating a first outside temperature, whereas a plurality of local column selection LY0 through LY7 having a second level, which is higher than the first level, may be provided to the column selection circuit 50 in response to the temperature signal indicating a second outside temperature. For example, referring to FIG. 6A, the level of a column selection signal LY can be regulated to ramp upward to track increasing outside temperatures. Alternatively, referring to FIG. 6B, the level of the column selection signal LY can be regulated to incrementally increase in stages in response to increasing outside temperatures.

Accordingly, when the outside temperature is relatively high, a plurality of local column selection signals LY0 through LY7 having a relatively high level may be provided to the local column selection switches SEL0 through SEL7 of the local column selection circuit 55, thereby increasing the amount of current flowing through the local column selection switches SEL0 through SEL7 in contrast to when a plurality of local column selection signals LY0 through LY7 having a low level are provided to the local column selection switches SEL0 through SEL7 of the local column selection circuit 55. In contrast, when the outside temperature is relatively low, a plurality of local column selection signals LY0 through LY7 having a relatively low level may be provided to the local column selection switches SEL0 through SEL7 of the local column selection circuit 55, thereby reducing the amount of current flowing through the local column selection switches SEL0 through SEL7 compared to when a plurality of local column selection signals LY0 through LY7 having a high level are provided to the local column selection switches SEL0 through SEL7 of the local column selection circuit 55.

Thus, although the resistance on the path of a penetration current (such as a write current or a read current) flowing through the chosen nonvolatile memory cell MC can vary in response to variation in the outside temperature, it may be possible to reduce variation in the penetration current by adjusting the levels of the local column selection signals LY0 through LY7 provided to the local column selection circuit 55 to regulate the amount of current flowing through the local column selection switches SEL0 through SEL7. Therefore, it may be possible to prevent/avoid write/read errors caused by variations in the temperature outside the nonvolatile memory device and thereby improve the write/read performance of the nonvolatile memory device.

Figure 7:
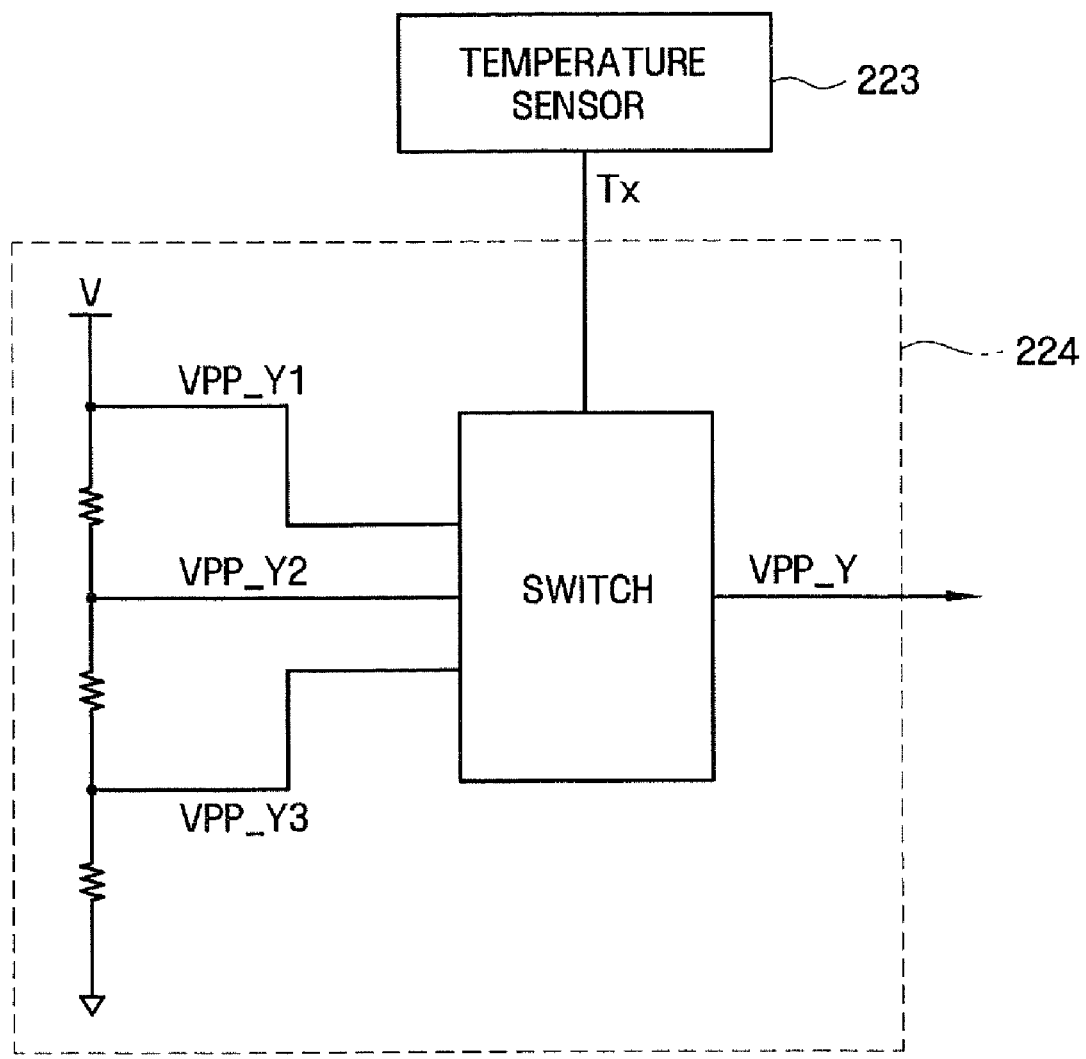
FIG. 7 illustrates a circuit diagram of the column bias controller shown in FIG. 2 according to some exemplary embodiments of the present invention.

FIG. 7 illustrates a circuit diagram of the column bias controller 220 shown in FIG. 2. Referring to FIG. 7, the column bias controller 220 may include a temperature sensor 223 that senses temperature outside the nonvolatile memory device to generate a temperature signal TX. The temperature sensor 223 may be located outside the nonvolatile memory device to sense the air temperature adjacent to the nonvolatile memory device and/or to sense the temperature of a heat sink or another electronic component that indicates a temperature outside the nonvolatile memory device that can have an undesirable effect on the read/write reliability/performance of the nonvolatile memory device. The column bias controller 220 can include a column bias generator 224 that is configured to generate the column bias VPP_Y whose voltage varies in response to the temperature signal TX. The temperature sensor 223 may include a plurality of temperature sensing circuit branches that respectively output different temperature signals in response to different outside temperatures. The column bias generator 224 may include a voltage divider providing a plurality of voltages VPP_Y1 through VPP_Y3, which are different from one another, and a switch that selects one of the voltages VPP_Y1 through VPP_Y3 in response to the temperature signal TX and outputs the selected voltage as the column bias VPP_Y.

The column bias generator 224 may incrementally increase the voltage of the column bias VPP_Y in stages in response to the temperature signal TX indicating changes in the outside temperature, such as shown in FIG. 6B. However, the present invention is not restricted to this particular embodiment. For example, the column bias generator 224 may more continuously ramp the voltage level of the column bias VPP_Y upward in response to the temperature signal TX indicating corresponding increasing outside temperature, such as shown in FIG. 6A.

Thus, in some embodiments, the levels of the local column selection signals LY0 through LY7, which are provided to the local column selection circuit 55 of the column selection circuit 50, may thereby be regulated in response to the outside temperature, in accordance with various embodiments herein. In some other embodiments, the levels of local column selection signals LY0 through LY7 and the levels of global column selection signals may both be regulated in response to the outside temperature. In still some other embodiments, only the levels of global column selection signals may be regulated in response to the outside temperature.

Figure 8:
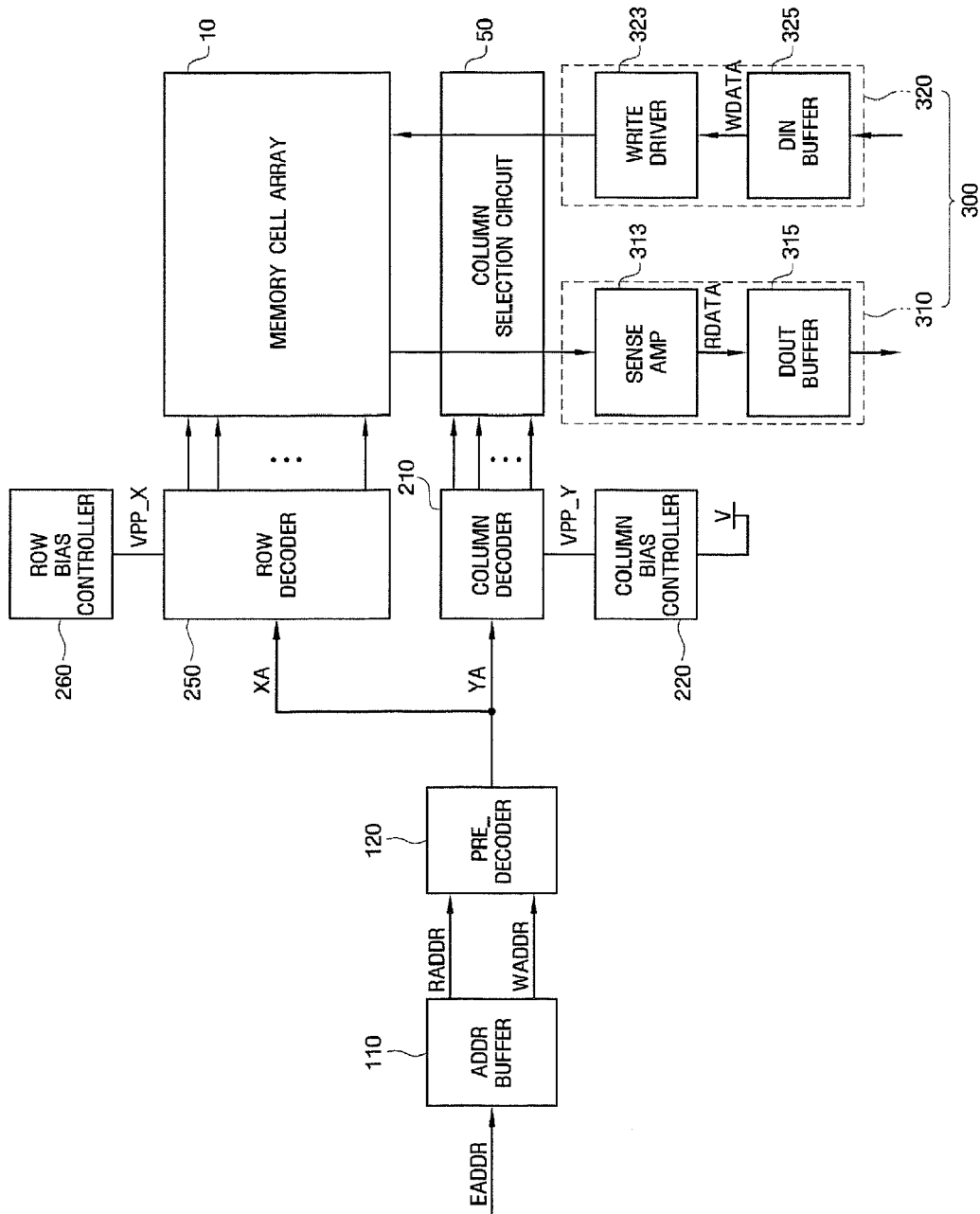
FIG. 8 illustrates a schematic block diagram of a nonvolatile memory device according to some other exemplary embodiments of the present invention.

FIG. 8 illustrates a schematic block diagram of a nonvolatile memory device according to some other exemplary embodiments of the present invention. The nonvolatile memory device shown in FIG. 8, unlike the nonvolatile memory device shown in FIG. 2, may include a row bias controller 260. The row bias controller 260 may receive a predetermined voltage, and may thus provide a row bias VPP_X, whose level is regulated in response to an outside temperature signal indicating the outside temperature, to a row decoder 250. For example, the row decoder 250 may be configured to regulate the level of a row selection signal, which is to be applied to a row selection circuit (not shown), in response to the outside temperature indicated by an outside temperature signal.

More specifically, in the exemplary embodiments of FIG. 8, the level of a row selection signal that is used to select among of a plurality of wordlines may be regulated in response to the temperature outside the nonvolatile memory device as indicated by a temperature signal from a temperature sensor. For example, in the exemplary embodiments of FIG. 8, not only the level of a column selection signal but also the level of a row selection signal may be regulated in response to the temperature outside the nonvolatile memory device.

Therefore, in the exemplary embodiments of FIG. 8, it may be possible to provide a penetration current (such as a write current or a read current) flowing through a chosen nonvolatile memory cell is within a desirable range although the resistance on the path of the penetration current can vary in response to variation in the outside temperature. Therefore, it may be possible to compensate for the effects of outside temperature so as to prevent/avoid write/read errors associated with outside temperature variation, which may substantially improve the write/read reliability/performance of a nonvolatile memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device comprising:
   a memory cell array including a matrix of nonvolatile memory cells;
   a plurality of bitlines coupled to a plurality of nonvolatile memory cell columns in the memory cell array;
   a column selection circuit that selects among the bitlines in response to a column selection signal; and
   a controller that regulates a level of the column selection signal in response to a temperature signal from a temperature sensor.

2. The nonvolatile memory device of claim 1, wherein:
   the controller includes the temperature sensor; and
   the temperature sensor is configured to measure temperature outside the nonvolatile memory device to generate the temperature signal.

3. The nonvolatile memory device of claim 1, wherein the controller causes the column selection signal to have a first level in response to the temperature signal indicating a first temperature and causes the column selection signal to have a second level, which is higher than the first level, in response to the temperature signal indicating a second temperature that is higher than the first temperature.

4. The nonvolatile memory device of claim 1, wherein the controller is configured to operate during a write operation for writing data to the memory cell array so as to regulate the level of the column selection signal in response to the temperature signal during the write operation.

5. The nonvolatile memory device of claim 1, wherein the controller comprises:
   a column bias controller that is configured to output a column bias having a level that is regulated in response to the temperature signal; and
   a column decoder that is configured to provide the column selection signal in response to the column bias and a column address.

6. The nonvolatile memory device of claim 5, wherein the column bias controller includes the temperature sensor that generates the temperature signal and includes a column bias generator that is configured to provide a column bias whose voltage is regulated in response to the temperature signal.

7. The nonvolatile memory device of claim 1, further comprising:
   a plurality of wordlines coupled to a plurality of nonvolatile memory cell rows in the cell array; and
   a row selection circuit that is configured to select among the wordlines in response to a row selection signal,
   wherein the controller regulates a level of the row selection signal in response to the temperature signal.

8. The nonvolatile memory device of claim 1, wherein the nonvolatile memory cells are diode-controlled phase-change random access memory (PRAM) cells.

9. A nonvolatile memory device comprising:
   a memory cell array including a matrix of nonvolatile memory cells;
   a plurality of wordlines coupled to a plurality of nonvolatile memory cell rows in the cell array;
   a plurality of bitlines coupled to a plurality of nonvolatile memory cell columns in the memory cell array;
   a column selection circuit that selects among the bitlines in response to a column selection signal;
   a column decoder that provides the column selection signal to the column selection circuit; and
   a controller that regulates a level of the column selection signal in response to a temperature signal from a temperature sensor.

10. The nonvolatile memory device of claim 9, wherein:
    the controller includes the temperature sensor; and
    the temperature sensor is configured to measure temperature outside the nonvolatile memory device to generate the temperature signal.

11. The nonvolatile memory device of claim 9, wherein the controller causes the column selection signal to have a first level in response to the temperature signal indicating a first temperature and causes the column selection signal to have a second level, which is higher than the first level, in response to the temperature signal indicating a second temperature that is higher than the first temperature.

12. The nonvolatile memory device of claim 9, wherein:
    the controller comprises a column bias controller that is configured to output a column bias having a level that is regulated in response to the temperature signal; and
    the column decoder is configured to provide the column selection signal in response to the column bias and a column address.

13. The nonvolatile memory device of claim 12, wherein the column bias controller includes the temperature sensor that generates temperature signal and includes a column bias generator that is configured to provide a column bias whose voltage in regulated in response to the temperature signal.

14. The nonvolatile memory device of claim 13, wherein the temperature sensor includes a plurality of temperature sensing circuit branches respectively outputting different temperature signals in response to different temperatures.

15. The nonvolatile memory device of claim 9, wherein:
    the bitlines include a plurality of local bitlines and a plurality of global bitlines;
    the local bitlines are directly coupled to the nonvolatile memory cell columns; and
    the global bitlines are selectively coupled to the local bitlines.

16. The nonvolatile memory device of claim 15, wherein:
    the column selection circuit is a local column selection circuit that selects among the local bitlines in response to a local column selection signal;
    the column decoder is a local column decoder that is configured to provide the local column selection signal to the local column selection circuit; and
    the controller is configured to regulate the level of the local column selection signal in response to the temperature signal.

17. The nonvolatile memory device of claim 9, further comprising a row selection circuit that selects among the wordlines in response to a row selection signal, wherein the controller is configured to regulate the level of the row selection signal in response to the temperature signal.

18. The nonvolatile memory device of claim 9, wherein the nonvolatile memory cells are diode-controlled PRAM cells.

19. The nonvolatile memory device of claim 1, wherein the controller causes incremental discrete changes to the level of the column selection signal in response to the temperature signal from the temperature sensor.

20. The nonvolatile memory device of claim 9, wherein the controller causes incremental discrete changes to the level of the column selection signal in response to the temperature signal from the temperature sensor.

* * * * *